United States Patent
Homma

(10) Patent No.: US 6,916,522 B2
(45) Date of Patent: Jul. 12, 2005

(54) CHARGE-GIVING BODY, AND PATTERN-FORMED BODY USING THE SAME

(75) Inventor: Takayuki Homma, Tokyo (JP)

(73) Assignee: Waseda University, Tokyo (JP)

( * ) Notice: Subject to any disclaimer, the term of this patent is extended or adjusted under 35 U.S.C. 154(b) by 77 days.

(21) Appl. No.: 10/314,540

(22) Filed: Dec. 9, 2002

(65) Prior Publication Data

US 2003/0186022 A1 Oct. 2, 2003

(30) Foreign Application Priority Data

Mar. 26, 2002 (JP) ........................................ 2002-086772
Apr. 2, 2002 (JP) ........................................ 2002-100300

(51) Int. Cl.[7] ................................................ B32B 3/00
(52) U.S. Cl. ........................ 428/141; 428/620; 428/195
(58) Field of Search ................................ 428/141, 195, 428/620, 641, 446; 423/323

(56) References Cited

U.S. PATENT DOCUMENTS 6,110,834 A * 8/2000 Kinoshita et al. ........... 438/706
6,174,727 B1 1/2001 Homma et al. ................ 436/5

FOREIGN PATENT DOCUMENTS

DE 19829863 A1 * 5/1999 ......... H01L/21/308

OTHER PUBLICATIONS

L. Santinacci, T. Djenizian, and P. Schmuki, "*Atomic Force Microscopy–Induced Nanopatterning of Si(100) Surfaces*" Journal of The Electrochemical Society, 148 (9) C640–C646 (2001).

* cited by examiner

Primary Examiner—Stephen Stein
(74) Attorney, Agent, or Firm—Ladas & Parry LLP

(57) ABSTRACT

A main object of the present invention is to provide a charge-giving body capable of forming a pattern having a minute structure on a surface of a semiconductor by a simple process; and a minute pattern-formed body. The present invention is a charge-giving body, comprising a defected region in which defect is introduced into a crystal structure in a crystalline semiconductor surface, charge being given from the defected region.

8 Claims, 10 Drawing Sheets

0 μm                                              3.00 μm

0 μm　　　　　　　　　　　3.00 μm

0 μm    3.00 μm

0nm   1.00 μm

0 μm   1.00 μm

0 μm          9.00 μm

0 μm                                    2.50 μm

0 μm    3.00 μm

0μm 3.00μm

0 μm                    10.00 μm

0 μm    3.00 μm

CHARGE-GIVING BODY, AND PATTERN-FORMED BODY USING THE SAME

BACKGROUND OF THE INVENTION

1. Field of the Invention

The present invention relates to a charge-giving body in a surface of a semiconductor used mainly as an electronic device or the like, and a pattern-formed body in a surface of a semiconductor.

2. Description of the Related Art

A pattern-formed body in a surface of a semiconductor can be generally used for a diode, a transistor, an integrated circuit (IC) or the like as an electric device or the like.

Conventionally, a pattern in a surface of such a semiconductor is generally formed by photolithography. It is known that photolithography is a method of transferring a pattern formed on a surface of a glass mask substrate or the like, as a resist pattern, to a surface of a substrate made of a semiconductor such as Si, and comprises the processes of applying and forming a resist onto a surface of a semiconductor, exposing the resist to light, developing the resist, conducting etching treatment, and removing the resist.

In recent years, in order to make the integration degree of semiconductor devices high, make the operation thereof highly speedy, or make the semiconductors small-sized, it has been demanded to make the minuteness degree of a formed/worked pattern high. Therefore, by photolithography, it is difficult to form a minute pattern in a surface of a semiconductor.

Thus, EB lithography is used, wherein a resist film is exposed to an electron beam without using any mask. This method has an advantage of high precision but has a problem that image-drawing speed is small.

In both of the methods, a large number of processes are required, and facilities for the processes are also required. Thus, these methods are complicated and expensive.

SUMMARY OF THE INVENTION

Accordingly, an object of the present invention is to provide a charge-giving body making it possible to form a pattern having a minute structure in a surface of a semiconductor by a simple process, and a minute pattern-formed body.

The present invention provides a charge-giving body, comprising a defected region in which defect is introduced into a crystal structure in a crystalline semiconductor surface, charge being given from the defected region.

According to the present invention, by comprising a defected region in which defect is introduced into a crystal structure in a crystalline semiconductor surface, the surface potential in the defected region is shifted to a negative in the case that the semiconductor is of a p-type, or is shifted to a positive in the case that the semiconductor is of an n-type. In this way, it makes a charge-giving body possible that the defected region gives charge into some other substance.

The charge-giving body of the present invention is preferred that the crystalline semiconductor is an n-type semiconductor and the given charge is positive charge. The matter that the crystalline semiconductor is of an n-type makes it possible to shift the surface potential in the defected region to a positive and give positive charge. In this way, a substance such as an oxide or a ceramic can be precipitated on the defected region.

The charge-giving body of the present invention is preferred that the defected region is formed by mechanical treatment applied to the crystalline semiconductor surface. By forming the defected region in the semiconductor surface by mechanical treatment, the defected region can be made into a target pattern form. Moreover, the target pattern can be made into a minute pattern having a fine pattern width of several nanometers, dependently on the manner of forming the defected region. Furthermore, the magnitude of the potential shift of the surface in the defected region depends on the degree of the introduced defect; therefore, by adjusting the magnitude of the defect based on the mechanical treatment, the magnitude of the potential shift of the surface can be adjusted and a precipitation source can be selectively added to the surface.

The present invention provides a pattern-formed body, wherein the defected region in the charge-giving body is formed, in a pattern form, in the crystalline semiconductor surface.

According to the present invention, by exposing the charge-giving body, in which the defected region is formed into a pattern form, to an environment containing a precipitation source, electrons are given from the defected region so that a precipitation makes a target pattern. As a result, a final pattern-formed body can be produced. Moreover, the present invention is unnecessary to supply energy, such as electricity, from the outside to the pattern-formed body. Accordingly, the pattern-formed body can be inexpensively formed.

The pattern-formed body of the present invention is preferred that chemical reaction is generated by charge given from the defected region, and a reactant generated by the chemical reaction is precipitated on the defected region. The surface potential in the defected region is shifted to a negative in the case that the semiconductor is of a p-type, or is shifted to a positive in the case that the semiconductor is of an n-type. For this reason, charge can be given from the defected region. By exposing the pattern-formed body to an environment containing a precipitation source, the chemical reaction is spontaneously caused so that the reactant is precipitated on the defected region. In this way, a pattern can be formed.

The pattern-formed body of the present invention is preferred that an adsorbate is adsorbed by the charge given from the defected region, and the adsorbate is adsorbed on the defected region. The surface potential in the defected region is shifted to a negative in the case that the semiconductor is of a p-type, or is shifted to a positive in the case that the semiconductor is of an n-type. For this reason, by exposing the pattern-formed body to an environment containing a precipitation source, the defected region can adsorb a substance having a reverse charge so that a pattern can be formed.

The present invention comprises a defected region in which defect is introduced into a crystal structure in a crystalline semiconductor surface, whereby the surface potential in the defected region is shifted to a negative in the case that the semiconductor is of a p-type, or is shifted to a positive in the case that the semiconductor is of an n-type. In this way, there is produced a charge-giving body making it possible that the defected region gives charge into some other substance. By exposing the charge-giving body in which the defected region is formed into a pattern form to an environment containing a precipitation source, electrons are given from the defected region so that a precipitation makes a target pattern. As a result, a final pattern-formed body can be produced. Moreover, according to the present invention, it is unnecessary to supply energy such as electricity from the outside, to the pattern-formed body. Accordingly, the pattern-formed body can be inexpensively formed.

DETAILED DESCRIPTION OF THE PREFERRED EMBODIMENTS

Figure 1:
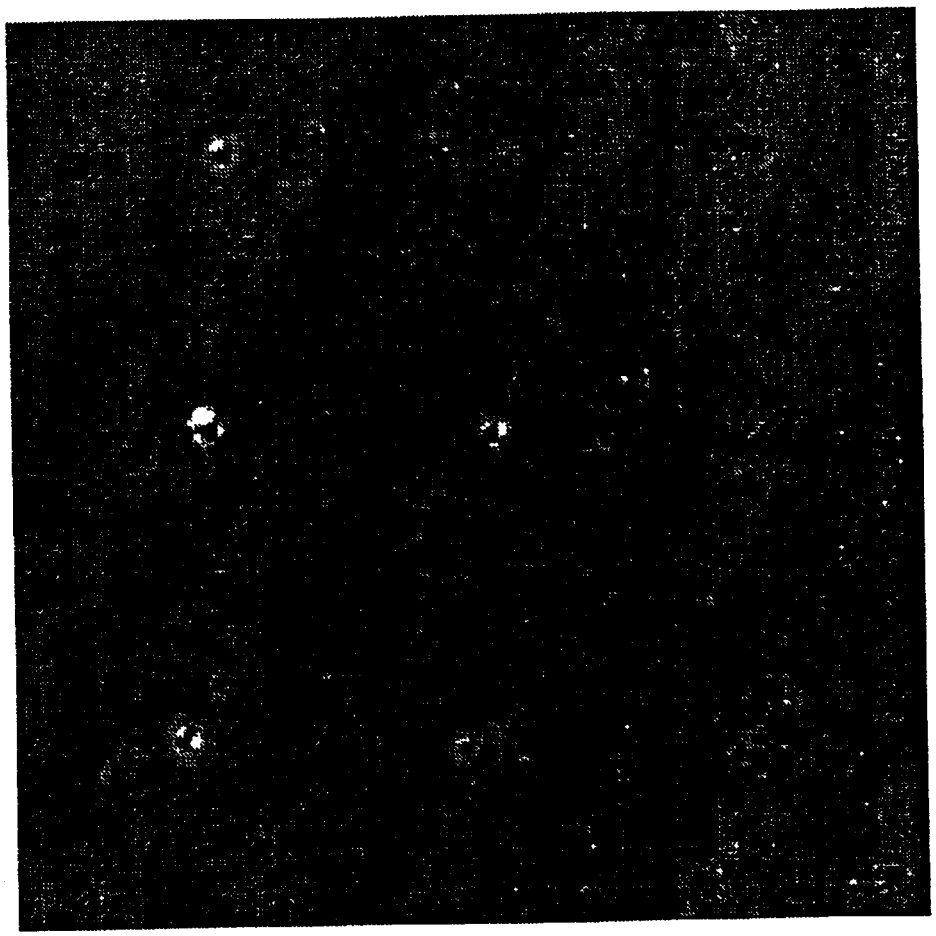
FIG. 1 is a photograph of an example of a pattern of a local defected region in the present invention, taken with a scanning probe microscope.

The present invention relates to a charge-giving body, comprising a defected region in which defect is introduced into a crystal structure in a crystalline semiconductor surface, charge being given from the defected region; and a pattern-formed body using this charge-giving body.

The following will describe the charge-giving body and the pattern-formed body of the present invention.

A. Charge-giving Body

The charge-giving body of the present invention is a charge-giving body in which defect such as strain, is introduced into a crystalline semiconductor surface, whereby charge can be given from the defected region. This will be firstly described in detail.

[Crystalline Semiconductor]

The kind of the crystalline semiconductor in the present invention is not particularly limited if the semiconductor has regularly-arranged crystal grains and the capability of being electrified. Examples of the crystalline semiconductor include Si semiconductors, Ge semiconductors, compound semiconductors, ceramic semiconductors, and polymer semiconductors.

The semiconductor in the present invention is crystalline; therefore, by introducing a defected region, which will be detailed later, into a surface of the crystalline semiconductor, the surface potential is locally shifted to a negative in the case that the semiconductor is of a p-type, or is shifted to a positive in the case that the semiconductor is of an n-type. Since the semiconductor can be temporarily electrified, the semiconductor can be made into a charge-giving body capable of giving charge to some other substance from this region in which the surface potential is shifted.

Examples of the crystalline semiconductor used in the present invention include p-type and n-type Si semiconductors, compound semiconductors each containing at least one element selected from the group consisting of Si, Ge, Ga, In, Cd and the like, and oxide semiconductors containing Zn and/or Ti. Preferred are p-type and n-type Si crystalline semiconductors having (100) orientation, (110) orientation, and (111) orientation; and compounds semiconductors each containing at least one element selected from the group consisting of Si, Ge, Ga, In Cd and the like.

In the present invention, the crystalline semiconductor is preferably of an n-type. When the crystalline semiconductor is of an n-type, the surface potential in the defected region, which will be detailed later, in the surface of the crystalline semiconductor is shifted to a positive. This makes it possible to give positive charge to some other substance. Therefore, a substance such as an oxide or a ceramic can be precipitated on the defected region.

Examples of the n-type semiconductor used in the present invention include Si crystalline semiconductors, Ge crystalline semiconductors, compound semiconductors each containing at least one element selected from the group consisting of Si, Ge, Ga, In, Cd and the like, and oxide semiconductors containing Zn and/or Ti. Preferred are Si crystalline semiconductors, Ge crystalline semiconductors, compound semiconductors each containing at least one element selected from the group consisting of Si, Ge, Ga, In and the like, and oxide semiconductors containing Zn or Ti.

[Defected Region]

The defected region in the present invention is a region in which local defect is introduced into a surface of the crystalline semiconductor. The defect is a phenomenon that concave structure is introduced into a crystal lattice in the crystalline semiconductor surface. The depth, the size and so on of the defected region, as long as it is formed in the crystal lattice in the crystalline semiconductor surface, are not particularly limited. The defected region may be formed in the whole of the crystalline semiconductor surface.

In the present invention, this defected region is preferably a region having a clean surface for the following reason. In the case that the surface potential for producing a charge-giving body is not shifted only by forming the uneven structure in the crystalline semiconductor surface, for example, in such the case as that the defected surface is covered with an oxide film, the surface potential is not shifted even in the crystalline semiconductor having the uneven structure.

Examples of the method for introducing this defect include mechanical treatment with a hard probe, jet spray of slurry or the like, irradiation of a corpuscular ray, and chemical treatment with solution. The present invention is preferred that the defect is introduced by mechanical treatment because the defect is easily caused to have a target pattern or a minute pattern having a pattern width of about several nanometers to several hundred micrometers can be formed.

The quantity of the potential shift in the crystalline semiconductor surface depends on the degree that the defect is introduced. Thus, in the case that the defect is large, a larger potential shift is observed. In light of this fact, by adjusting the degree that the defect is introduced, charge can be selectively given to plural kinds of substances whose potential shifts necessary for precipitation or adsorption are different.

Specific examples of the mechanical treatment include indenting of a hard probe, scratch, and embossment of a hard mold in which a pattern is beforehand formed.

[Charge-Giving Body]

The charge-giving body of the present invention is a charge-giving body, comprising a defected region in which the defect is introduced into a surface of the above-mentioned crystalline semiconductor, charge being given from the defected region. Since the defected region is present in the crystalline semiconductor surface, the surface potential in the defected region is locally shifted to a negative in the case that the semiconductor is of a p-type, or is shifted to a positive in the case that the semiconductor is of an n-type. This makes it possible to produce a charge-giving body capable of giving charge to some other substance. By making the defected region of this charge-giving body into a target pattern, a pattern-formed body, which will be detailed below, can be formed.

B. Pattern-formed Body

The pattern-formed body of the present invention is a pattern-formed body, wherein the defected region in the charge-giving body is formed, in a pattern form, in the crystalline semiconductor surface.

In the present invention, the pattern-formed body is preferably a body wherein adsorption or chemical reaction is generated by the charge given from the defected region of the charge-giving body, and a reactant generated by the adsorption or the chemical reaction is precipitated to form a pattern. Since the charge is given from the defected region in the charge-giving body, in the atmosphere containing reactants, adsorption or redox reaction is spontaneously conducted between the defected region and the reactants so that a pattern can be formed in the crystalline semiconductor surface. Since this redox reaction or adsorption advances spontaneously, it is unnecessary to supply energy such as electricity from the outside to the pattern-formed body and complicated processes or devices are unnecessary. Thus, the pattern-formed body can be inexpensively produced by a simple method.

The following will describe this matter.

[Redox Reaction]

The pattern-formed body of the present invention is preferably formed by the phenomenon that redox reaction is generated in the defected region in the charge-giving body to precipitate a substance on the defected region. In the charge-giving body, the surface potential is shifted to a positive or negative potential in the defected region. Accordingly, charge can be given to an active substance. For this reason, by exposing the charge-giving body to an environment containing a precipitation source, redox reaction is spontaneously conducted in the defected region. By making the crystalline semiconductor beforehand into a charge-giving body in which defect corresponding to a target pattern is introduced, a substance can be precipitated on the target pattern. As a result, a final pattern can be formed.

By exposing the charge-giving body in which the potential shifted in the defected region is adjusted to an environment containing plural kinds of substances whose potential shifts necessary for precipitation are different, charge can be selectively given onto the target pattern.

The environment containing the precipitation source, mentioned above, may be in liquid phase or in gas phase.

Since the surface potential in the defected region is shifted to a negative in the case that the crystalline semiconductor is of a p-type, reduction reaction with a metal ion or an organic molecule which has positive charge can be generated and can be precipitated on the defected region. Dependently on the shape of the pattern of the defected region, for example, a minute element having a function such as wiring, a resistance or the like can be formed. Specific examples thereof include minute wiring made by precipitation of Cu, Ag, Au, or an alloy thereof, a resistor made by precipitation of Ni or an alloy thereof, a magnetic body made by precipitation of Co, Ni or an alloy thereof, suicides made by precipitating Co, Ni, W or Pd and then reacting the precipitated metal with Si near the surface.

Since the surface potential in the defected region is shifted to a positive in the case that the crystalline semiconductor is of an n-type, a magnetic body having negative charge or an oxide of a ceramic or the like can be precipitated by oxidation reaction. In this way, for example, an insulating layer, a semiconductor, or the like can be formed dependently on the shape of the pattern of the defected region. Specific examples thereof include an insulting layer or a dielectric layer made of Si oxide, a magnetic body made of Fe oxide, and a semiconductor, a photo function body or a catalyst function body made of zinc oxide or titanium oxide.

[Adsorption]

The pattern-formed body of the present invention is preferably formed by the phenomenon that adsorption reaction is caused in the defected region in the charge-giving body to precipitate a substance adsorbed on the defected region. In the charge-giving body, the surface potential is shifted in the defected region; therefore, the defected region can adsorb a substance having reverse charge by Coulomb force. For this reason, by exposing the charge-giving body to an environment containing a substance having charge, adsorption reaction is spontaneously caused in the defected region. By making the crystalline semiconductor beforehand into a charge-giving body into which defect corresponding to a target pattern is introduced, a substance can be adsorbed onto the target pattern. In this way, a pattern-formed body can be produced. The environment in which the adsorption is performed may be in liquid phase or in gas phase. Examples of the substance which can be adsorbed include metal ions, inorganic ions containing sulfur or nitrogen, and organic compounds and polymers containing one or more selected from a hydroxide group, a carbonyl group, an amine group and a thiol group.

[Process for Producing a Pattern-formed Body]

A process for producing the pattern-formed body of the present invention can be separated to a cleaning process of cleaning the above-mentioned charge-giving body and a reaction process of precipitating or adsorbing a reactant onto the above-mentioned defected region. These will be described hereinafter.

a. Cleaning Process

The surface potential shift in the defected region of the charge-giving body of the present invention is not exhibited in the case that an oxide film or an impurity is present on its surface, and the shift is exhibited only on the clean surface made clean. Accordingly, the process of cleaning the charge-giving body into which defect is introduced is required. However, cleaning the surface, and the like, with a solution having an effect of dissolving crystal in the charge-giving body, such as an alkali solution, in the cleaning process for obtaining the clean surface, the defected region in the outermost layer becomes extinct so that the potential shift is not exhibited. As a result, a pattern cannot be formed. In cleaning with hydrofluoric acid or the like, any portion other than a target pattern is also activated when the entire surface is excessively activated by the cleaning. Therefore, the target pattern cannot be formed.

Thus, in the cleaning process in the present invention, the charge-giving body is cleaned with ultra pure water in the atmosphere, thereby forming an oxide film on the surface. In this way, the activity of the entire surface is decreased, and subsequently the charge-giving body is immersed into, for example, a hydrofluoric acid solution, thereby cleaning the surface. This process makes it possible to improve the activity of the surface of the charge-giving body and form only the target pattern.

Specific examples of the manner of the cleaning include immersion into cleaning solution, spray of cleaning solution, and exposure to ion beams or plasma.

The concentration of the hydrofluoric acid solution in this process is preferably within the limit of 0.001% and 20%, particularly preferred to be within the limit of 0.5% and 5%.

b. Reaction Process

In the reaction process in the present invention, the charge-giving body treated in the cleaning process is exposed to an environment in liquid phase or gas phase containing a precipitation source (reactant), whereby reaction is spontaneously caused in the defected region. The surface potential in the defected region in the surface of the charge-giving body is activated by the cleaning process, and the activity of the portion other than the defected region is decreased. As a result, reaction is caused only in the defected region, so that the target pattern can be formed.

The reaction process of a pattern-formed body in the present invention may be performed in liquid phase or in gas phase.

About reaction conditions for forming the pattern, the temperature of the reaction environment is preferably within the limit of 0° C. and 90° C., particularly preferred to be within the limit of 5° C. and 80° C. When the temperature of the reaction environment is within this range, the above-mentioned redox reaction or adsorption reaction advances spontaneously and efficiently.

The concentration of the precipitation source in the reaction environment is preferably within the limit of 0.1 ppb and 1000 ppm, particularly preferred to be within limit of 10 ppb and 100 ppm. When the concentration of the precipitation source is within this range, the redox reaction or adsorption of the precipitation source can be conducted in the defected region for the target pattern and reaction in the portion other than the defected region can be suppressed.

A plurality of the precipitation sources may be used. By containing several precipitation sources into the environment, one or more out of the precipitation sources can be selectively precipitated or adsorbed on the target pattern, dependently on the magnitude of the potential shift in the defected region.

In the present invention, a reaction inhibitor or the like may be added to the reaction system. By adding the reaction inhibitor or the like to the system containing the plural precipitation sources, one or more out of these sources can be selectively reacted. On the other hand, a reaction accelerator for accelerating the reaction of specific one out of the precipitation sources may be added to the reaction system. This specific precipitation source may itself be reacted so as to be precipitated or adsorbed, or may acts as a catalyst. This is because in the system containing the precipitation sources, these sources can be selectively reacted by adding the reaction accelerator.

A plurality of the reaction inhibitors or the reaction accelerators may be simultaneously added. They may be added one by one during the reaction. The addition concentration thereof may be changed with the passage of time. These manners make it possible to control the precipitated or adsorbed substances continuously and also form patterns having plural functions in a lump.

The present invention is not limited to the above-mentioned embodiments. These embodiments are mere examples. Any embodiment having substantially the same subject matters as defined in the claims of the present invention, and exhibiting the same effects and advantages are included in the scope of the present invention.

EXAMPLES

The present invention will be more specifically described by Examples and Comparative Examples hereinafter.

(A) Pretreatment and Formation of a Pattern.

The surface of a p-type silicon wafer is pre-cleaned by the following method.

(1) The wafer is immersed into a mixed solution of 96% sulfuric acid and 40% hydrogen peroxide water (volume ratio=4:1) at 120° C. for 10 minutes.

(2) The wafer is cleaned with ultra pure water.

(3) The wafer is immersed into dilute hydrofluoric acid aqueous solution (for example, 0.5%) at ambient temperature for about 1 minute.

A local defect pattern is introduced into the clean surface obtained by the above-mentioned cleaning process. For example, the surface is scratched or indented with a probe made of diamond, so as to form a pattern illustrated in FIG. 1. Thereafter, cleaning is performed in the same way as described above, to activate the pattern site.

(B) Optimization of a Solution Composition

Figure 2:
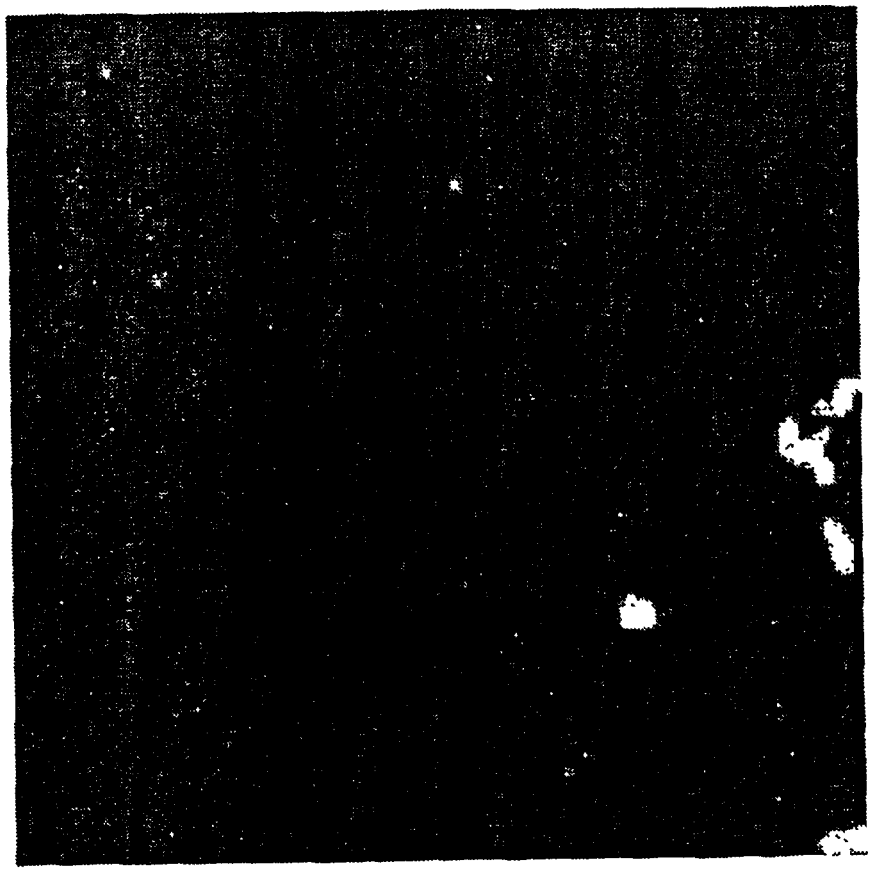
FIG. 2 is a photograph of an example of the pattern-formed body of the present invention, taken with a scanning probe microscope.
Figure 3:
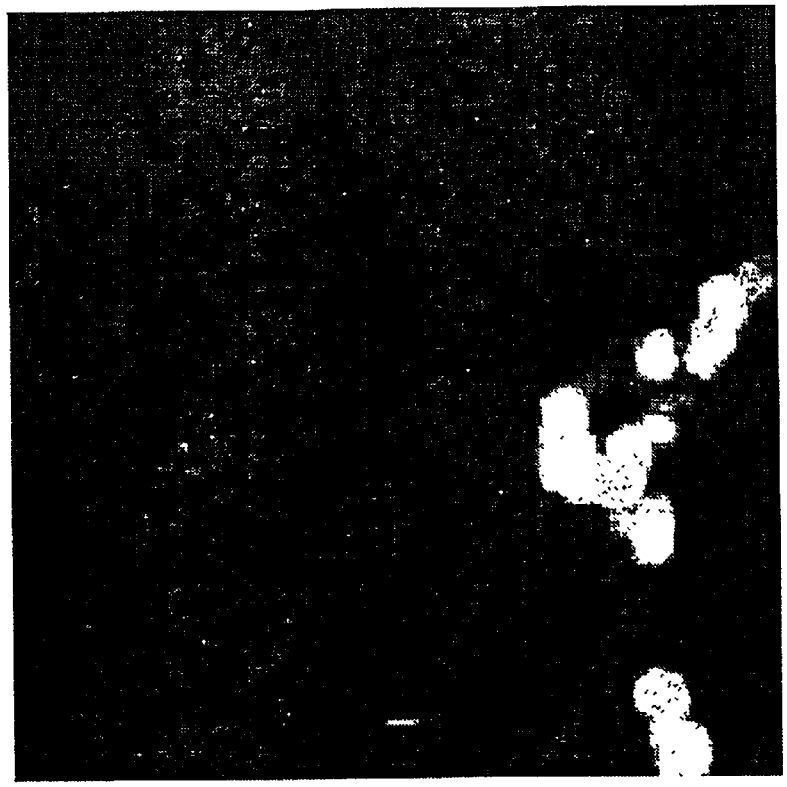
FIG. 3 are photographs of an example of the pattern-formed body of the present invention and the potential shift thereof, taken with a scanning probe microscope.
Figure 3:
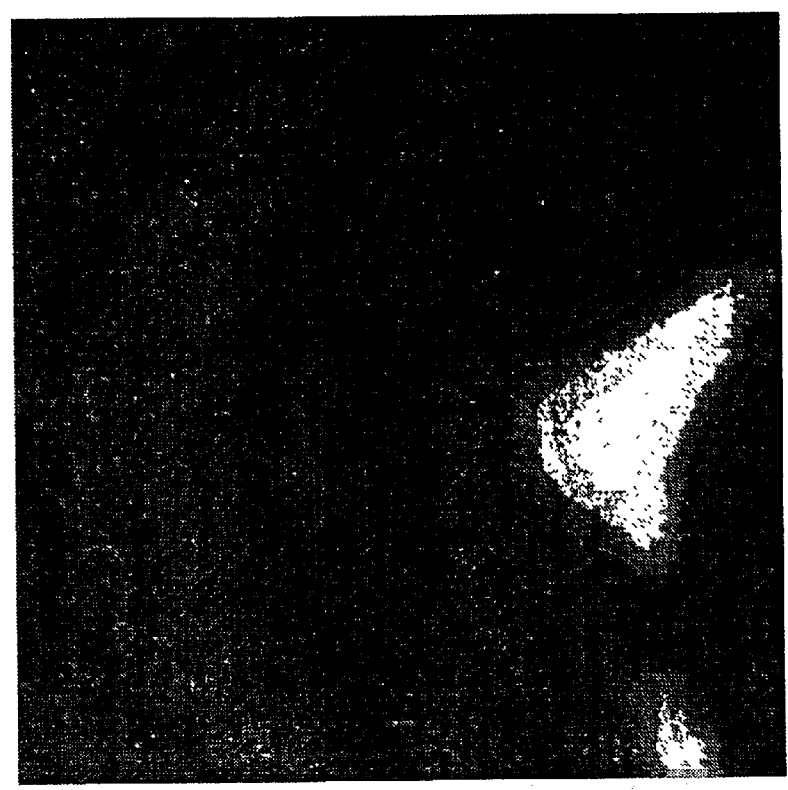
Figure 4:
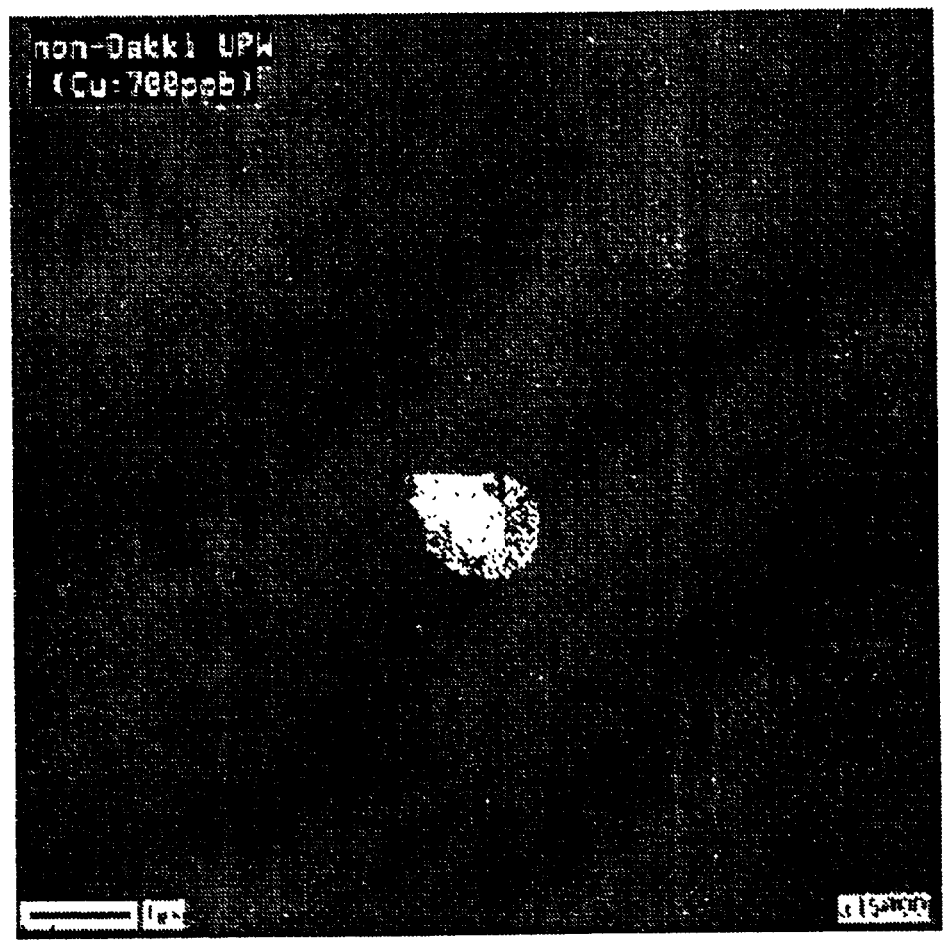
FIG. 4 is a photograph of an example of the pattern-formed body of the present invention, taken with a scanning Auger microscope.

In the region where the pattern is formed, the surface potential is shifted to a negative. In this state, when the wafer in this state, is immersed into a solution containing metal ions, spontaneous reduction precipitation reaction of the metal ions is caused in the pattern-formed region so that fine metal nuclei are formed as illustrated in FIG. 2. In this region, the potential shift to the negative, as illustrated in FIG. 3, is kept as well after the metal precipitates. Thus, preferential precipitation is continuously caused. Electrons are supplied by spontaneous oxidation of silicon near the metal-precipitated region. As a result, a silicon oxide layer, as illustrated in FIG. 4, is formed around the metal-precipitated region.

The fact to which attention should be paid is that any clean silicon surface itself exhibits activity to reduction precipitation of metal ions to some degree. Needless to say, the pattern-formed region has higher activity. However, when the metal ions are in the state that they have sufficient (or excessive) capability of precipitating a metal (for example, in the state that the concentration of the ions is relatively high), precipitation is also caused from a region other than the defect-introduced region. Thus, the composition of the solution is optimized for the precipitation. An example thereof will be described hereinafter.

Figure 5:
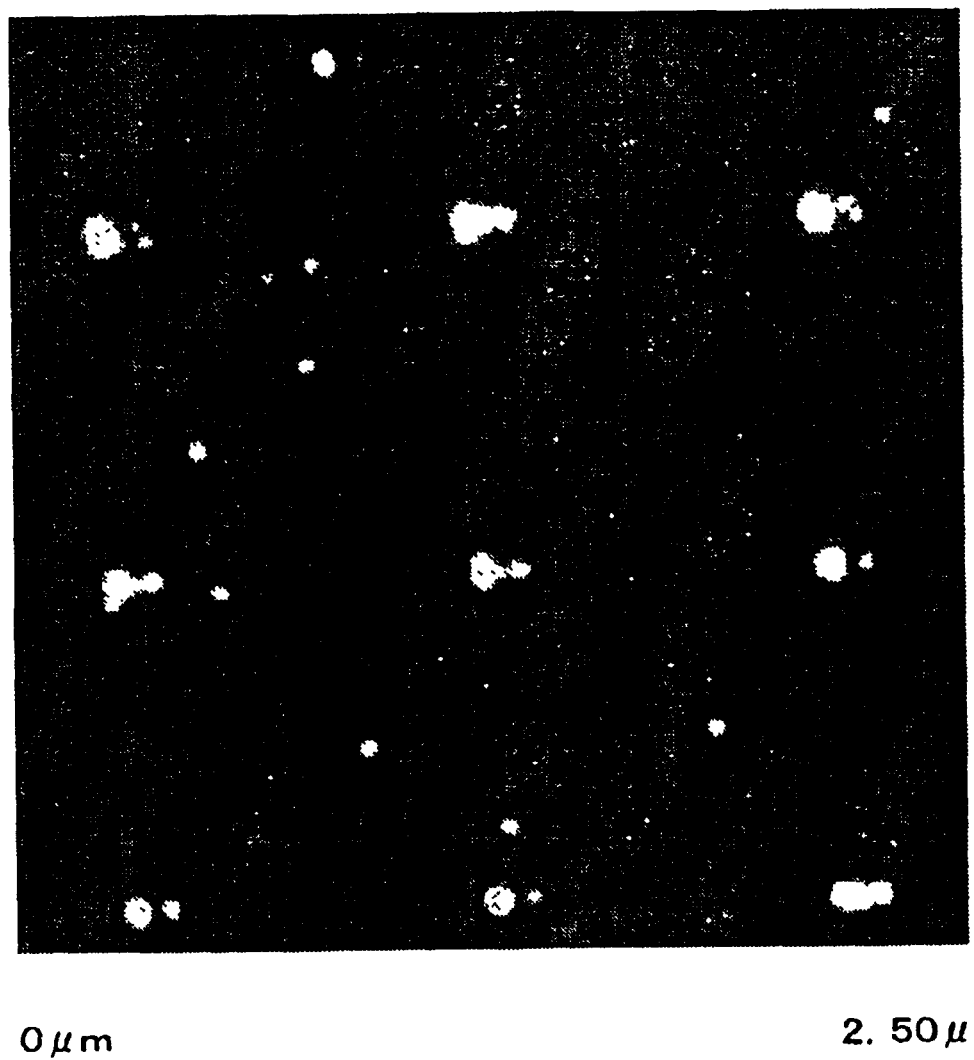
FIG. 5 is a photograph of an example of the pattern-formed body of the present invention, taken with a scanning probe microscope.

A wafer, which the pattern illustrated in FIG. 1 was introduced, was immersed into a 0.5% hydrofluoric acid solution containing 200 ppb of Cu ions for 1 minute. A state that fine Cu structure was formed in this case is illustrated in FIG. 5. As is clear from FIG. 5, Cu was precipitated in a region other than the pattern-introduced region.

Since hydrofluoric acid has a surface-cleaning effect (that is, "an activating effect"), it can be considered that by excessive activation of the entire surface of the wafer, precipitation was caused not only in the defect-introduced region but also in the other region. It is known that when a silicon wafer is immersed into ultra pure water wherein air is saturated at room temperature, an oxide layer is formed on the wafer surface. This means inactivation of the surface. Thus, the inventors researched conditions such that the precipitations will occur in a high selectivity only in the defect-introduced region, by optimizing the balance between the activation based on the effect of hydrofluoric acid and the inactivation based on the effect of ultra pure water; and optimizing the concentration of metal ions.

Figure 6:
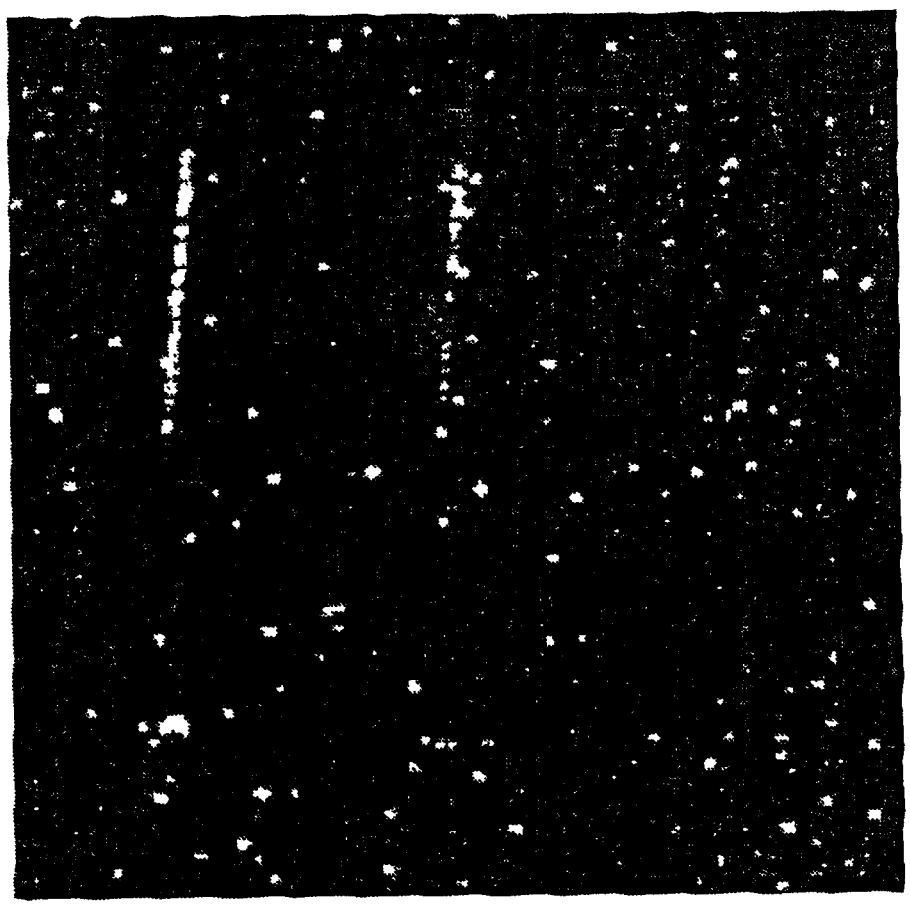
FIG. 6 is a photograph of an example of the pattern-formed body of the present invention, taken with a scanning probe microscope.

FIG. 6 shows results obtained from an examination under the following conditions: the concentration of hydrofluoric acid: 0.25%; the concentration of Cu ions: 200 ppb; and immersion time: 1 minute. It can be understood that the activity for the precipitation is too high even under the conditions.

Figure 7:
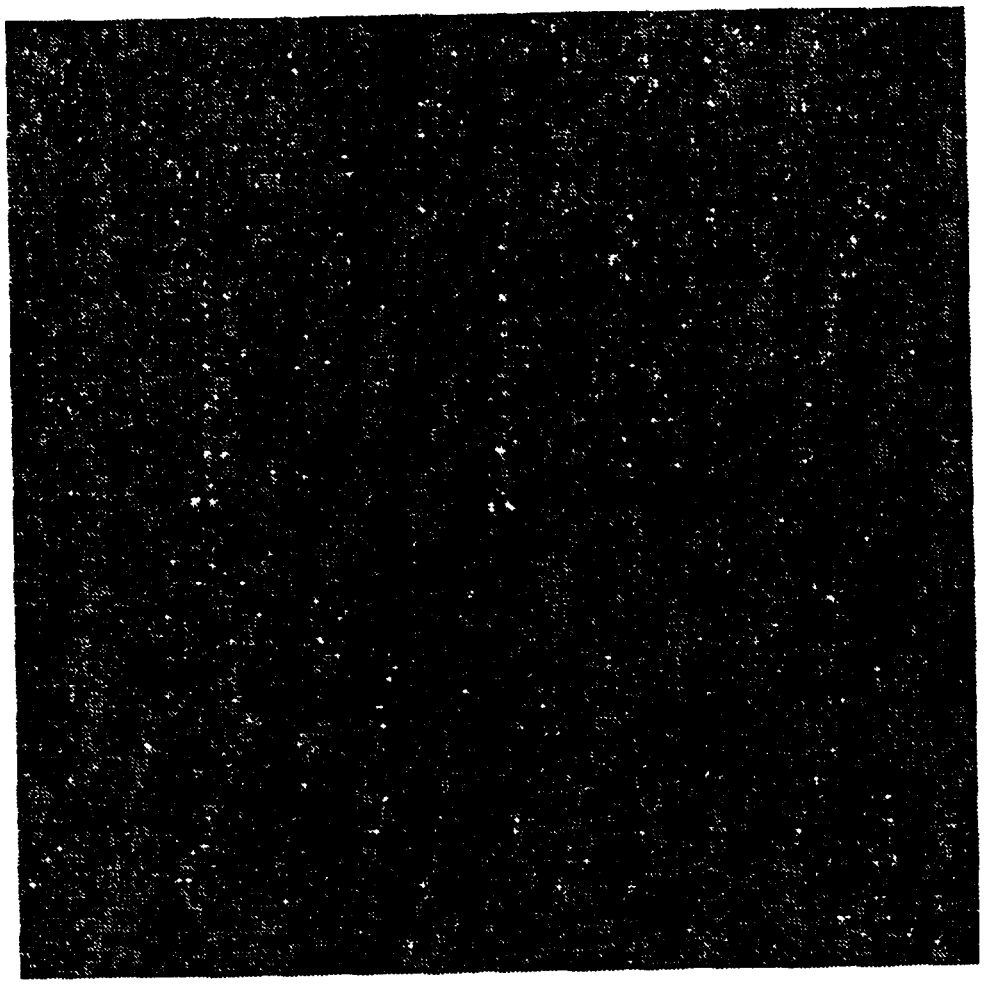
FIG. 7 is a photograph of an example of the pattern-formed body of the present invention, taken with a scanning probe microscope.

Thus, the concentration of hydrofluoric acid was set to 0.025%. The results are shown in FIG. 7. In this case, selective precipitation was caused in the pattern region, but the amount of the precipitation was insufficient. Accordingly, it is necessary to make the immersion time longer, or make the concentration of the metal ions higher. Since the former approach also promotes the inactivation of the pattern region, the latter approach was selected.

Figure 8:
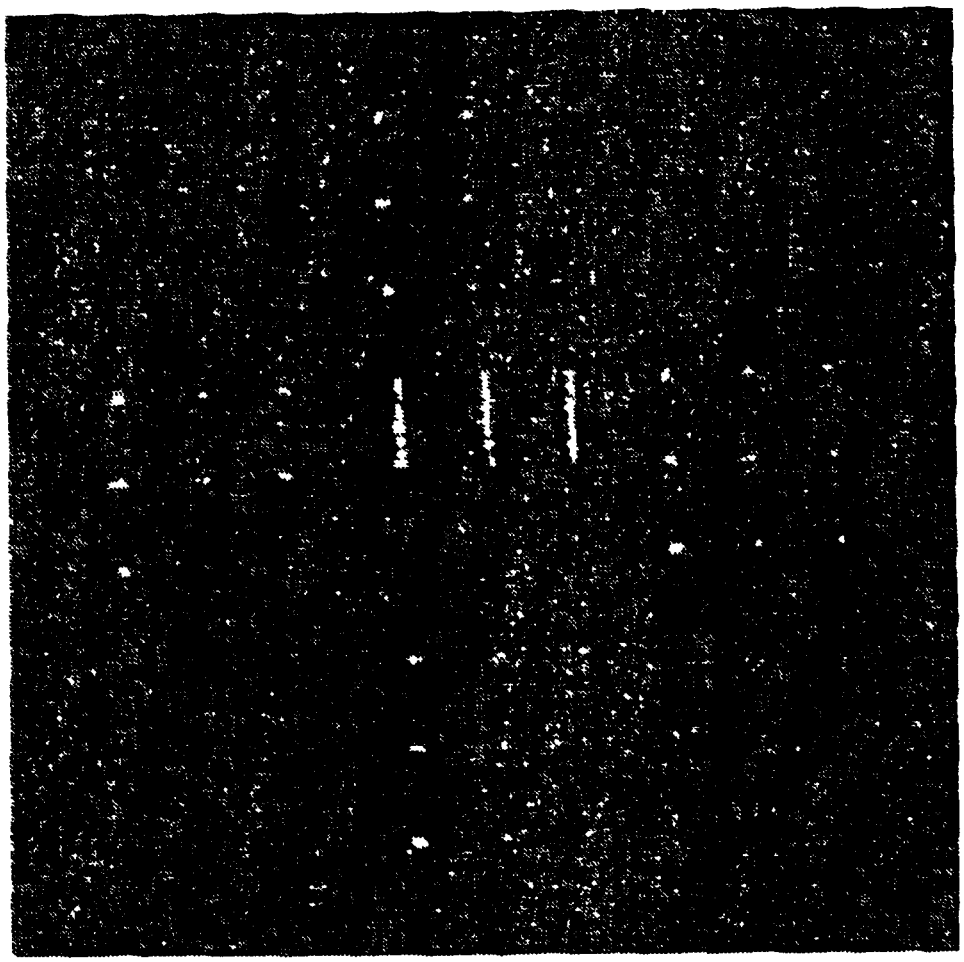
FIG. 8 is a photograph of an example of the pattern-formed body of the present invention, taken with a scanning probe microscope.

As a result, selective precipitation was realized only in the pattern region, as illustrated in FIG. 8. Conditions in this case were as follows: the concentration of hydrofluoric acid: 0.025%; the concentration of Cu ions: 500 ppb; and immersion time: 1 minute.

Figure 9:
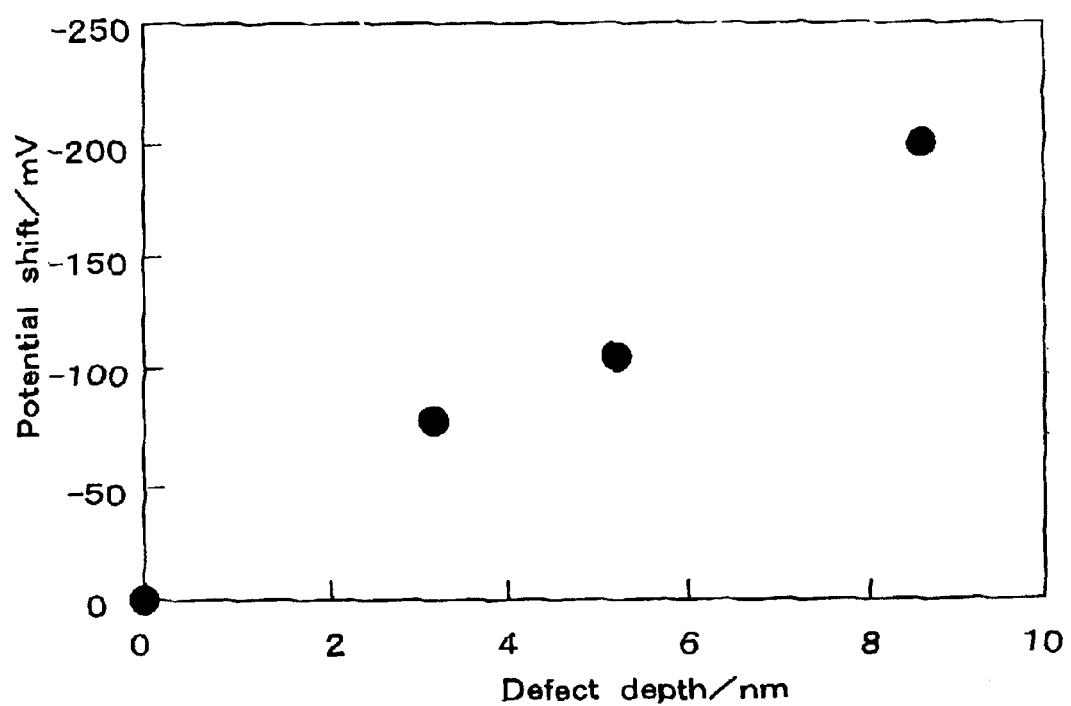
FIG. 9 is a graph showing a relationship between the degree of defect and amount of potential shift in present invention.
Figure 10:
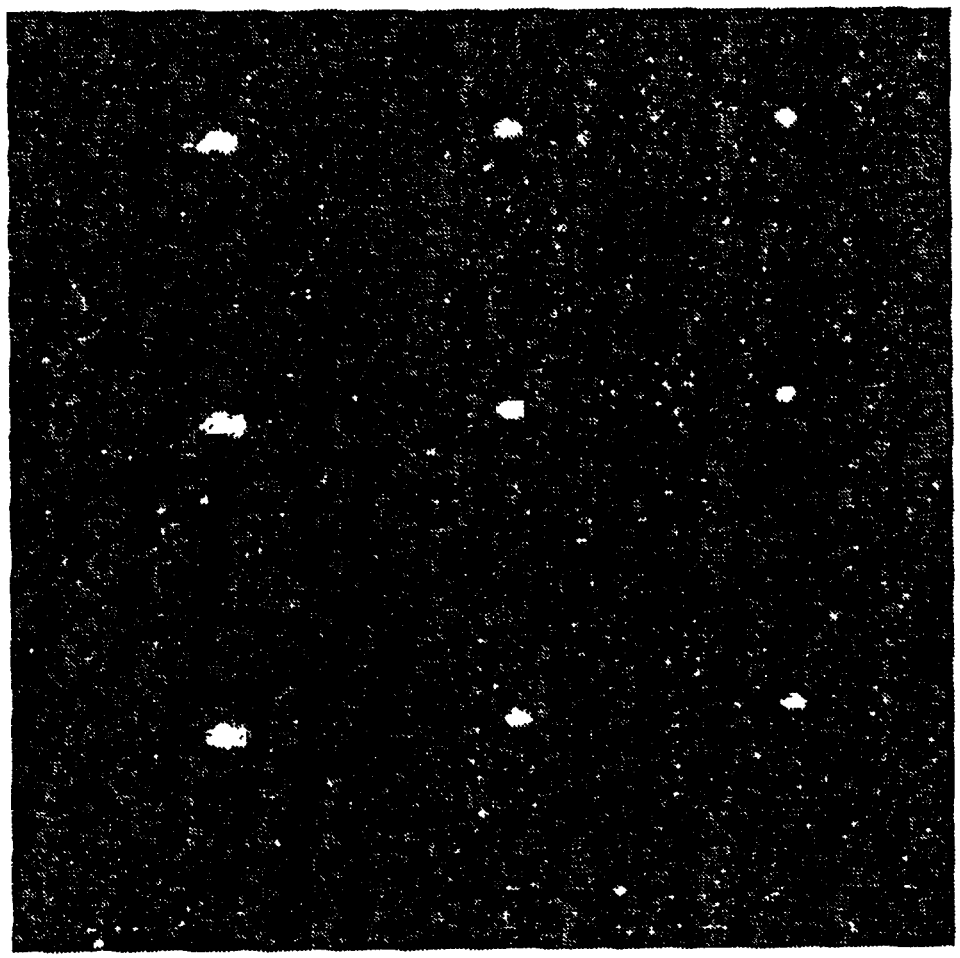
FIG. 10 is a photograph of an example of the pattern-formed body of the present invention, taken with a scanning probe microscope.

Next, on the basis of the finding from FIG. 9, the inventors made an examination on precipitation control based on difference in the degree that defect were introduced. FIG. 10 shows a state that a Cu precipitation was formed onto a defected region where an indent was made by changing load. It can be understood from FIG. 10 that the diameter of the precipitation was larger in the defect-introduced region on the left side. The indentation loads when the defect was introduced were 14.1 $\mu$N, 9.8 $\mu$N, and 5.4 $\mu$N, respectively, from the left. As illustrated in FIG. 9, as the defect is large, the potential shift is larger so that the precipitation activation is higher. FIG. 10 supports this fact.

The results of FIG. 10 demonstrate that the precipitation amount of the single metal ion species can be controlled on the basis of the quantity of the potential shift. It appears that selective precipitation from plural ion species can also be controlled. Since metal species are different in ionization tendency, low ionization tendency species (species which are easily reduced and precipitated) such as Au and Cu are precipitated even by a relatively low potential shift (activity). However, a higher activity is necessary to precipitate higher ionization tendency species such as Ni. Thus, for example, in the case that these ion species are intermixed in a solution, a system as shown in FIG. 10 is supposed. In this case, it can be presumed that there arises a phenomenon that high ionization tendency species and low ionization tendency species are intermixed in the region having large defect and only the low ionization tendency species are precipitated in the region having small defect. Using this fact, it can be considered that a pattern having a function, such as a pattern wherein a Ni-based resistor or a Co-based magnetic body is embedded in fine Cu wiring, can be spontaneously formed in a lump. In this case, it is important to optimize not only the ionization tendency but also other factors, for example, the pH of the solution.

What is claimed is:

1. A pattern-formed body, comprising a charge-giving body having a defected region, in a pattern form, in which a defect is introduced into a crystal structure in a crystalline semiconductor surface, charge being given from the defected region, and wherein a chemical reaction is generated by charge given from the defected region of the charge-giving body and a reactant generated by the chemical reaction is precipitated on the defected region.

2. The pattern-formed body according to claim 1, wherein the crystalline semiconductor is an n-type semiconductor, and the given charge is positive charge.

3. The pattern-formed body according to claim 1, wherein the defected region is formed by mechanical treatment applied to the crystalline semiconductor surface.

4. The pattern-formed body according to claim 2, wherein the defected region is formed by mechanical treatment applied to the crystalline semiconductor surface.

5. A pattern-formed body, comprising a charge-giving body having a defected region, in a pattern form, in which a defect is introduced into a crystal structure in a crystalline semiconductor surface, charge being given from the defected region, and wherein an adsorbate adsorbed by the charge given from the defected region of the charge-giving body, and the adsorbate is adsorbed on the defected region.

6. The pattern-formed body according to claim 5, wherein the crystalline semiconductor is an n-type semiconductor, and the given charge is positive charge.

7. The pattern-formed body according to claim 5, wherein the defected region is formed by mechanical treatment applied to the crystalline semiconductor surface.

8. The pattern-formed body according to claim 6, wherein the defected region is formed by mechanical treatment applied to the crystalline semiconductor surface.

* * * * *